(12) United States Patent
Economikos et al.

(10) Patent No.: US 6,368,969 B1
(45) Date of Patent: Apr. 9, 2002

(54) CHEMICAL-MECHANICAL POLISHING METHODS

(75) Inventors: Laertis Economikos; Fen Fen Jamin, both of Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/607,350

(22) Filed: Jun. 30, 2000

(51) Int. Cl.[7] .................... H01L 21/302; H01L 21/461
(52) U.S. Cl. .................. 438/690; 438/691; 438/692; 438/693; 451/41; 451/288; 451/388
(58) Field of Search ................. 438/692, 693, 438/690, 691; 451/41, 288, 388

(56) References Cited

U.S. PATENT DOCUMENTS

| | | |
|---|---|---|
| 5,026,421 A | 6/1991 | Le Loarer et al. |
| 5,098,517 A | 3/1992 | Tygat et al. |
| 5,098,587 A | 3/1992 | Hooranaert et al. |
| 5,098,860 A | 3/1992 | Chakravorty et al. |
| 5,514,287 A | 5/1996 | Jones et al. |
| 5,525,837 A | 6/1996 | Choudhury |
| 5,576,579 A | 11/1996 | Agnello et al. |
| 5,614,437 A | 3/1997 | Choudhury |
| 5,798,903 A | 8/1998 | Dhote et al. |
| 5,804,513 A * | 9/1998 | Sakatani et al. ............ 438/693 |
| 5,818,092 A | 10/1998 | Bai et al. |
| 5,830,806 A | 11/1998 | Hudson et al. |
| 5,899,745 A | 5/1999 | Kim et al. |
| 5,931,719 A * | 8/1999 | Nagahara et al. ............ 451/41 |
| 6,083,840 A * | 7/2000 | Mravic et al. ............ 438/693 |
| 6,184,141 B1 * | 2/2001 | Avanzino et al. ........... 438/692 |

OTHER PUBLICATIONS

L. Zhang, et al,. Iinhibition of Alumina Particle Deposition onto SiO2 Surfaces During Tungsten CMP Through the Use of Citric Acid, Electrochemical Society Proceedings, vol. 98–7, pp. 161–172.

* cited by examiner

Primary Examiner—Matthew Smith
Assistant Examiner—V. Yeviskov
(74) Attorney, Agent, or Firm—Steven Capella

(57) ABSTRACT

The polishing uniformity of a material on a substrate is improved by using a polishing method where an applied pressure on the backside of the substrate is changed during the polishing process. The method is especially useful for polishing thin material layers requiring precise control of polishing across the substrate, e.g., for TaSiN layers used in the formation of gate stacks and stacked capacitors.

17 Claims, 3 Drawing Sheets

CHEMICAL-MECHANICAL POLISHING METHODS

BACKGROUND OF THE INVENTION

In many integrated circuit designs, it is desirable to be able to configure shallow planar features. Unfortunately, achieving planarization of such features across an entire wafer containing a plurality of such features distributed across the wafer is very difficult. Typically, very tight control of the planarization process is necessary in order to avoid excessive loss of the material in certain areas of the wafer, especially where the wafer itself may have variations of thickness (e.g., due to warping, build-up of structures, etc.)

The ability to configure shallow planar layers across a semiconductor wafer is important in the configuration of thin layers for so-called stacked capacitors useful in memory arrays. One material that is desirable for use in such arrays are transition metal nitrides such as tantalum silicon nitride (TaSiN). TaSiN is especially useful for its oxygen diffusion barrier properties. Processes in current use generally have difficulty in providing a uniform TaSiN surface or require reduced polishing speed.

Thus, there is a need for improve polishing processes which are capable of planarizing shallow configuration materials, especially materials used in the formation of stacked capacitors.

SUMMARY OF THE INVENTION

The invention provides methods of improving the polishing uniformity of a material on a substrate. The methods of the invention involve use of a polishing an applied fluid pressure on the backside of the substrate which pressure is changed during the polishing process. The methods are especially useful for polishing thin material layers requiring precise control of polishing across the substrate, e.g., for TaSiN layers used in the formation of gate stacks and stacked capacitors.

In one aspect, the invention encompasses a method of polishing a surface of a substrate by chemical-mechanical polishing, the method comprising:

a) providing a substrate having first surface to be planarized and a second surface on an opposite side of the substrate from the first surface, the first surface having first and second regions, b) providing a liquid polishing medium, c) contacting the first surface with the liquid medium and a polishing member, and applying a first pressure against the second surface, and d) maintaining the contact and applied pressure of step c) while providing movement between the substrate and polishing member, whereby a first portion material of the first surface removed, e) contacting the first surface with the liquid medium and polishing member, and applying a second pressure against the second surface, and f) maintaining the contact and applied pressure of step e) while providing movement between the substrate and polishing member, whereby a second portion material of the first surface is removed, the first and second pressures being sufficiently different from each other whereby a ratio of material removal rate in step (f) in the first region to a material removal rate in step (f) in the second region is different compared to a corresponding material removal rate ratio for the regions in step (d).

The first surface preferably contains at least one transition metal nitride feature, more preferably a tantalum silicon nitride feature. The liquid medium is preferably a slurry containing a particulate abrasive (e.g., an alumina). The slurry is preferably aqueous and preferably also contains an oxidizer, a mineral acid, and hydrogen peroxide.

The method of the invention is especially useful for forming features having a planarized depth of about 1000 Å or less relative to an exposed surface of an adjacent material region of differing composition.

These and other aspects of the invention are described further below.

DETAILED DESCRIPTION OF THE INVENTION

The invention provides methods of improving the polishing uniformity of a material on a substrate. The methods of the invention involve use of a polishing an applied fluid pressure on the backside of the substrate which pressure is changed during the polishing process. The methods are especially useful for polishing thin material layers requiring precise control of polishing across the substrate, e.g., for TaSiN layers used in the formation of gate stacks and stacked capacitors.

The methods of the invention generally comprise:

a) providing a substrate having first surface to be planarized and a second surface on an opposite side of the substrate from the first surface, the first surface having first and second regions, b) providing a liquid polishing medium, c) contacting the first surface with the liquid medium and a polishing member, and applying a first pressure against the second surface, and d) maintaining the contact and applied pressure of step c) while providing movement between the substrate and polishing member, whereby a first portion material of the first surface removed, e) contacting the first surface with the liquid medium and polishing member, and applying a second pressure against the second surface, and f) maintaining the contact and applied pressure of step e) while providing movement between the substrate and polishing member, whereby a second portion material of the first surface is removed, the first and second pressures being sufficiently different from each other whereby a ratio of material removal rate in step (f) in the first region to a material removal rate in step (f) in the second region is different compared to a corresponding material removal rate ratio for the regions in step (d).

Figure 1:
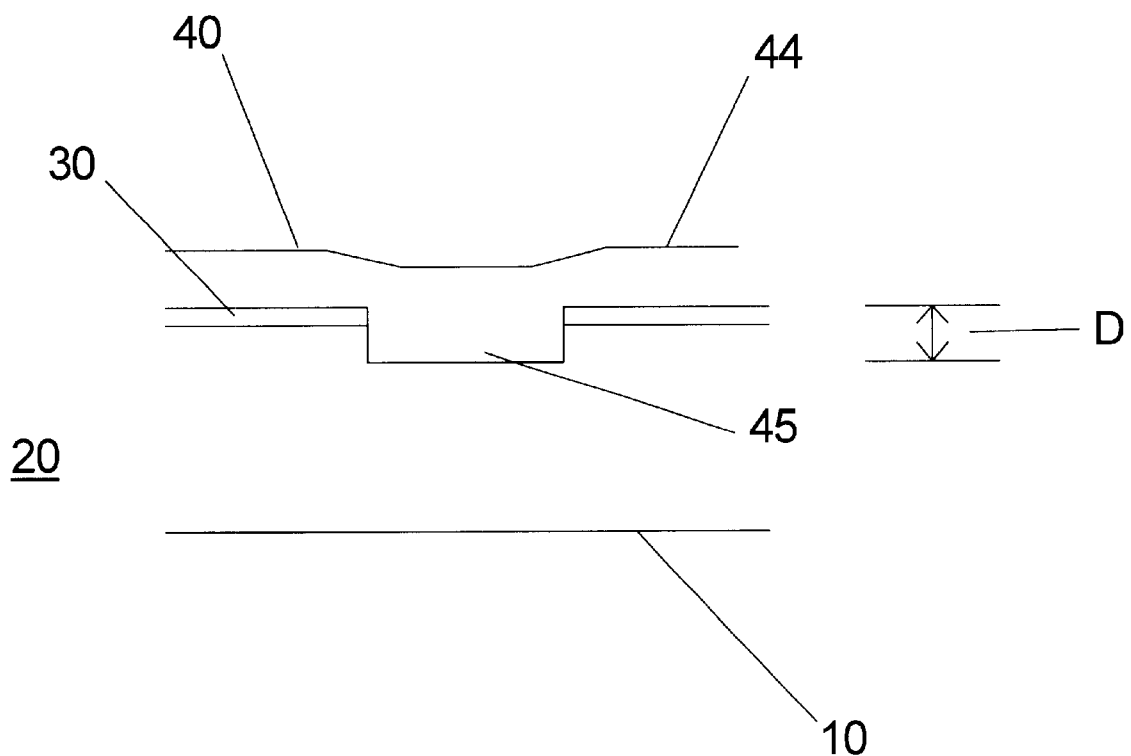
FIG. 1 shows a schematic cross section of a shallow feature on a substrate to be planarized.
Figure 2:
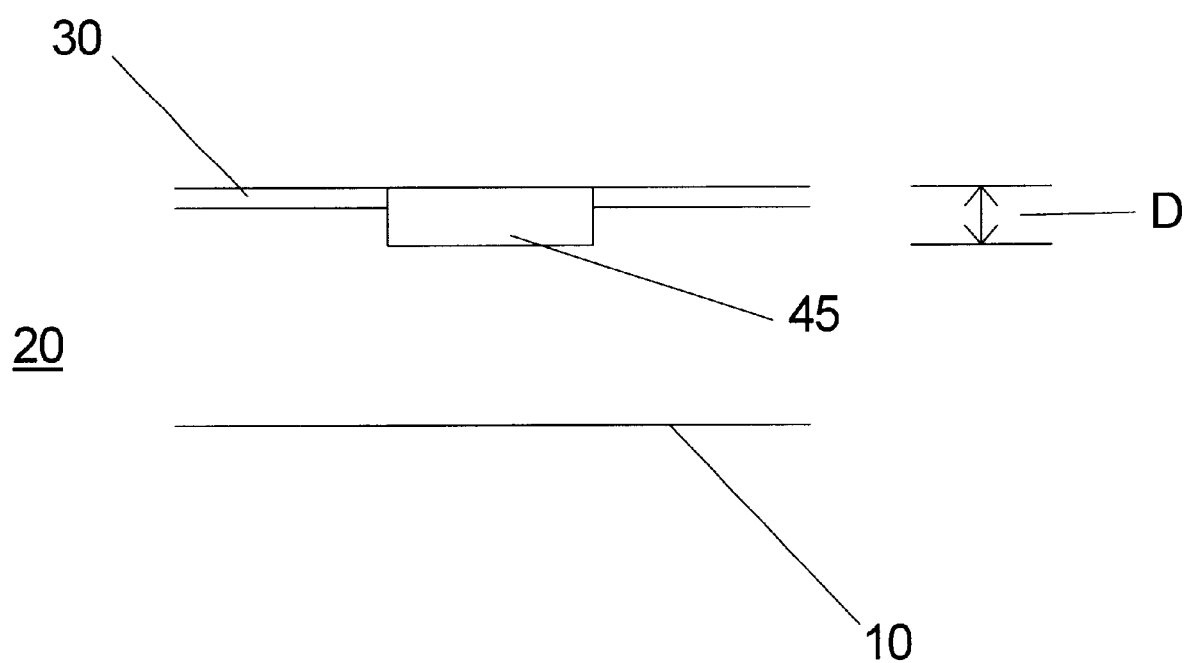
FIG. 2 shows a schematic cross section of a shallow feature of FIG. 1 after planarization.

Referring to FIG. 1, the substrate 20 is preferably a semiconductor wafer having one or more features 45 to be planarized. The method of the invention is especially useful for forming features having a planarized depth (D) of about 1000 Å or less relative to an exposed surface of an adjacent material region 30 of differing composition. The material layer 40 to be planarized may be formed by any desired techniques known in the art. For example, TaSiN layers may be formed in the manner described in U.S. Pat. Nos. 5,576,579 and 5,614,437, the disclosures of which are incorporated herein by reference. The substrate can generally be characterized as having a first surface 44 to be planarized and a second surface 10 which is placed against a backing material 130 (FIGS. 3A and 3B).

Figure 3A:
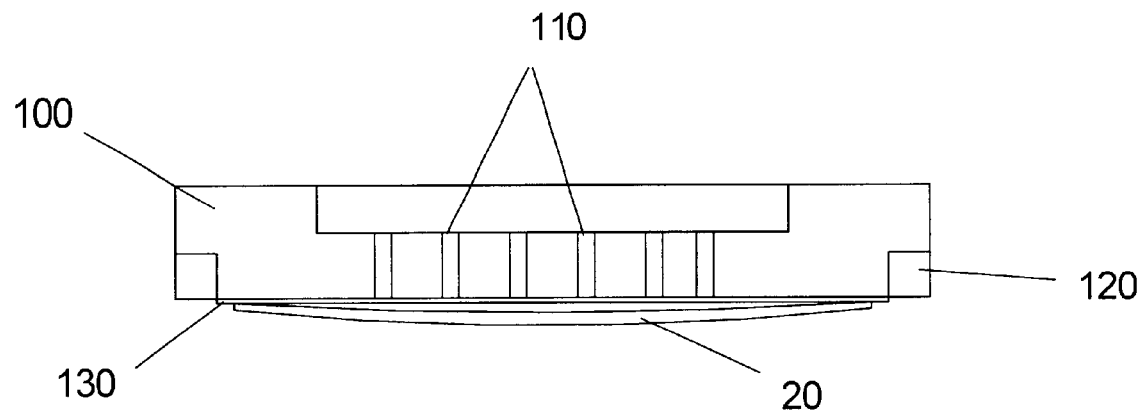
FIG. 3A shows a schematic cross section of a carrier with air holes and wafer with a first applied fluid pressure.
Figure 3B:
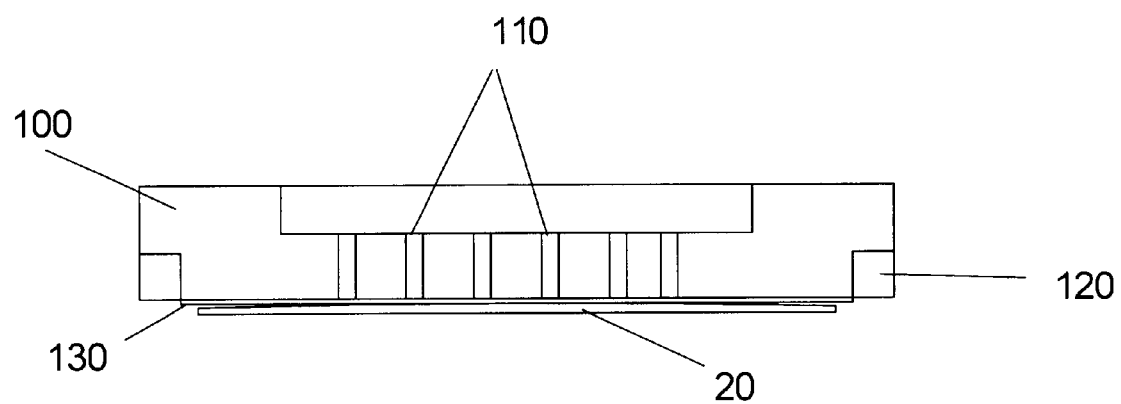
FIG. 3B shows a schematic cross section of FIG. 3A with a second applied fluid pressure causing flexing of the wafer.

Referring to FIGS. 3A and 3B, the substrate 20 is placed on a carrier 100 (e.g., a 16-hole carrier provided with an IPEC 472 polisher sold by IPEC Planar Systems of Phoenix, Ariz.). Carrier 100 preferably contains holes 110 through which fluid pressure (e.g., vacuum, air, nitrogen) can be applied to the substrate, preferably through a porous backing layer 130 which resides between the carrier and the substrate. The backing layer is preferably a DF200 pad sold by Rodel Corporation of Newark, Del. Apart from requiring a CMP apparatus where different amounts of pressure can be applied to the backside of the substrate during polishing, the methods of the invention are otherwise not limited to use of any specific CMP set up or apparatus. Examples of CMP apparatus are disclosed in U.S. Pat. Nos. 5,830,806; 5,899,745; and 5,791,975, the disclosures of which are incorporated herein by reference.

The liquid medium used in the polishing steps is preferably a slurry of abrasive particles. The slurry preferably comprises an alumina abrasive, more preferably a gamma alumina abrasive. The abrasive preferably has an average particle size less than one micron, more preferably about 0.5–0.6 microns. The slurry preferably contains about 5–10 wt. % alumina. A preferred alumina slurry is AP/6 slurry sold by Intersurface Dynamics, Inc. of Bethel, Ct. The liquid medium also preferably contains an oxidizer, such as X40 or X200 oxidizers sold by Intersurface Dynamics, Inc. of Bethel, Ct. X200 is a preferred oxidizer for polishing TaSiN features where the stopping feature is a silicon nitride. The oxidizer is preferably added to the alumina slurry until a pH of about 4.5–5.5 is achieved, more preferably a pH of about 5.2. Where TaSiN features are being polished to a silicon nitride stopping feature, the liquid medium is preferably modified by the addition of about 2–4 wt. % hydrogen peroxide and about 2 wt. % or less of mineral acid (preferably nitric acid.) If desired, other additives to enhance selectivity or polishing speed may be incorporated into the liquid medium. For example, polyelectrolyte additives may be used such as disclosed in U.S. patent application Ser. No. 09/469,922, filed Dec. 22, 1999, the disclosure of which is incorporated herein by reference.

If desired, other polishing steps may be employed in addition to the method of steps a)–f) above, however, the method step f) is preferably conducted until the desired planarization is achieved, e.g., until a stop material feature is exposed to a desired extent.

The amount of pressure applied to the substrate in the polishing steps of the invention is preferably such that a differential amount of substrate flexion occurs in steps (c/d) compared to steps (e/f). For example, in FIG. 3A relatively little pressure is applied to the substrate such that much or all of the natural warping of the substrate remains in the first polishing step. The pressure applied in the second polishing step would then preferably be sufficient to cause a different flexion of the substrate such as shown in FIG. 3B. It should be understood that the invention is not limited to any specific sequence of applied pressure or amount of applied pressure as long as the amount of flexion of the substrate is varied between the first and second portions of the polishing process.

The methods of the invention are especially advantageous for obtaining planarization while stopping effectively on the underlayer where the feature to be polished has a shallow depth D. Thus, for example, the invention may be used to planarize features having a design depth of 1500 Å or less, more preferably 1000 Å or less even where the deviation of wafer uniformity is on the order of at least 300 Å (more typically at least 400–500 Å). Where the underlayer is designed to act as a stop layer, the invention may enable reduction in the thickness of that stop layer because of the increased ability of the methods of the invention to stop with high precision (i.e., without polishing through the stop layer). The invention also enables precise stopping of the polishing process without compromise of the polishing rate and without need for any special endpoint detection technique.

What is claimed is:

1. A method of polishing a surface of a flexible wafer capable of having a convex and/or concave surface by chemical-mechanical polishing, said method comprising:
   a) providing said wafer having first surface to be planarized and a second surface on an opposite side of said wafer from said first surface, said first surface having first and second regions,
   b) providing a liquid polishing medium,
   c) contacting said first surface with said liquid medium and a polishing member, and applying a first pressure against said second surface, and
   d) maintaining the contact and applied pressure of step c) while providing movement between said wafer and polishing member, whereby a first portion material of said first surface is removed,
   e) contacting said first surface with said liquid medium and polishing member, and applying a second pressure against said second surface, and
   f) maintaining the contact and applied pressure of step e) while providing movement between said wafer and polishing member, whereby a second portion material of said first surface is removed,
   said first and second pressures being sufficiently different from each other whereby a ratio of material removal rate in step (f) in said first region to a material removal rate in step (f) in said second region is different compared to a corresponding material removal rate ratio for said regions in step (d).

2. The method of claim 1 wherein said first surface contains at least one transition metal nitride feature.

3. The method of claim 2 wherein said transition metal is selected from the group consisting of tantalum and tungsten.

4. The method of claim 3 wherein said transition metal is tantalum.

5. The method of claim 4 wherein said nitride feature is a TaSiN feature.

6. The method of claim 1 wherein said liquid medium contains a particulate abrasive.

7. The method of claim 6 wherein said abrasive is an alumina.

8. The method of claim 7 wherein said abrasive is a gamma alumina.

9. The method of claim 1 wherein said liquid medium comprises is an aqueous medium.

10. The method of claim 9 wherein said liquid medium has a pH of about 4.5–5.5.

11. The method of claim 10 wherein said liquid medium has a pH of about 5.2.

12. The method of claim 11 wherein said liquid medium further comprises a mineral acid.

13. The method of claim 9 wherein said liquid medium comprises and oxidizer.

14. The method of claim 13 wherein said liquid medium further comprises hydrogen peroxide.

15. The method of claim 1 wherein said wafer comprises a silicon nitride region and step (f) is conducted until at least a portion of said silicon nitride region is exposed.

16. The method of claim 1 wherein said first and second fluid pressures cause different amounts of flexion in said wafer in steps (d) and (f) respectively.

17. The method of claim 1 wherein said wafer is maintained continuously in contact with said liquid medium from step (c) through step (f).

* * * * *